United States Patent
Tomiyama et al.

(10) Patent No.: US 9,028,070 B2
(45) Date of Patent: May 12, 2015

(54) LIGHT EMITTING ELEMENT HAVING STRUCTURAL BODIES ARRAYED AT A FIRST PITCH ALONG A FIRST DIRECTION AND ARRAYED AT A SECOND PITCH DIFFERENT FROM SAID FIRST PITCH ALONG A SECOND DIRECTION AND PROJECTION DISPLAY DEVICE PROVIDED WITH SAME

(75) Inventors: Mizuho Tomiyama, Minato-ku (JP); Ryuichi Katayama, Minato-ku (JP)

(73) Assignee: NEC Corporation, Tokyo (JP)

( * ) Notice: Subject to any disclaimer, the term of this patent is extended or adjusted under 35 U.S.C. 154(b) by 366 days.

(21) Appl. No.: 13/503,297

(22) PCT Filed: Oct. 15, 2010

(86) PCT No.: PCT/JP2010/068153
§ 371 (c)(1),
(2), (4) Date: Apr. 20, 2012

(87) PCT Pub. No.: WO2011/049018
PCT Pub. Date: Apr. 28, 2011

(65) Prior Publication Data
US 2012/0224147 A1    Sep. 6, 2012

(30) Foreign Application Priority Data
Oct. 23, 2009    (JP) .................... 2009-244434

(51) Int. Cl.
| | | |
|---|---|---|
| G02B 5/32 | (2006.01) |
| F21V 9/14 | (2006.01) |
| G02B 27/10 | (2006.01) |
| G03B 21/20 | (2006.01) |
| H01L 51/52 | (2006.01) |
| H01L 33/18 | (2010.01) |
| G02B 6/122 | (2006.01) |
| G02B 1/00 | (2006.01) |
| H04N 9/31 | (2006.01) |
| G03B 33/12 | (2006.01) |
| H01L 33/20 | (2010.01) |
| H01L 33/44 | (2010.01) |

(52) U.S. Cl.
CPC ........ *G03B 21/2073* (2013.01); *H01L 51/5293* (2013.01); *H01L 33/18* (2013.01); *G02B 6/1225* (2013.01); *G02B 1/005* (2013.01); *H04N 9/3167* (2013.01); *G03B 33/12* (2013.01); *H01L 33/20* (2013.01); *H01L 33/44* (2013.01); *H01L 2933/0083* (2013.01); *G03B 21/2033* (2013.01)

(58) Field of Classification Search
CPC ............... G03B 33/12; G03B 21/2073; G03B 21/2033; H01L 33/20; H01L 2933/0083; H01L 33/44; H01L 51/5293; H01L 33/18; H01L 21/02389; B82Y 20/00; G02B 6/1225; G02B 1/005; H04N 9/316; H04N 9/3105
USPC ................. 353/20; 257/98; 372/98, 103, 106; 362/606, 19; 359/619
See application file for complete search history.

(56) References Cited

U.S. PATENT DOCUMENTS

| | | | |
|---|---|---|---|
| 2005/0205884 A1 | 9/2005 | Kim et al. | |
| 2006/0221633 A1* | 10/2006 | Yamauchi | ..................... 362/606 |
| 2008/0012028 A1 | 1/2008 | Yoon et al. | |
| 2008/0277679 A1 | 11/2008 | Akimoto | |
| 2010/0238966 A1* | 9/2010 | Mochizuki | ..................... 372/99 |

FOREIGN PATENT DOCUMENTS

| | | |
|---|---|---|
| JP | 2005-268809 A | 9/2005 |
| JP | 2006-267417 A | 10/2006 |
| JP | 2006-310737 A | 11/2006 |
| JP | 2007-109689 A | 4/2007 |
| JP | 2008-016836 A | 1/2008 |
| JP | 2008-053425 A | 3/2008 |
| JP | 2008-060433 A | 3/2008 |
| JP | 2008-060534 A | 3/2008 |
| JP | 2008-283037 A | 11/2008 |

| JP | 2008311317 A | 12/2008 |
| JP | 2009-016370 A | 1/2009 |
| JP | 2009-111012 A | 5/2009 |
| JP | 2009206448 A | 9/2009 |
| JP | 2010-219307 A | 9/2010 |
| TW | 200541112 A | 12/2005 |

OTHER PUBLICATIONS

Zhuang Fei et al., "Large complete band gap of a two-dimensional Office Action dated Mar. 5, 2014, issued by the State Intellectual Property Office of the P.R.C. in corresponding Chinese Application No. 201080047758.0. photonic crystal consisting of anisotropic elliptic cylinders", Acta Physica Sinica, Feb. 28, 2002, pp. 356 to 361 (7 pages total) of Issue 2 of vol. 51.

Chen Jian et al., "Research of LED light extraction of photonic crystal with square and hexagonal lattice", Acta Physica Sinica, Sep. 30, 2009, pp. 6217 to 6221 (6 pages total) of Issue 9 of vol. 58.

International Search Report of PCT/JP2010/068153 dated Nov. 16, 2010.

Communication dated Feb. 3, 2015 from the Japanese Patent Office in counterpart application No. 2011-537225.

* cited by examiner

*Primary Examiner* — Toan Ton
*Assistant Examiner* — Magda Gruz
(74) *Attorney, Agent, or Firm* — Sughrue Mion, PLLC

(57) ABSTRACT

Provided is a light-emitting element having high luminance and high directivity and emitting light in a controlled polarization state. The light-emitting element comprises substrate 3 and light emitting part 10 disposed on substrate 3 for emitting light in which light intensity of a polarization component in first direction x parallel to substrate 3 is higher than light intensities of polarization components in other directions. Light emitting part 10 includes active layer 12 for generating light and a plurality of structural bodies 14a disposed on a light-emitting side of light emitting part 10 with respect to active layer 12 and arrayed two-dimensionally along a surface substantially parallel to active layer 12. Each of structural bodies 14a has width w1 along first direction x and width w2 along second direction y perpendicular to first direction x, width w1 along first direction x and width w2 along second direction y being different from each other in a cross section parallel to active layer 12. Structural bodies 14a are arrayed periodically at first pitch p1 along first direction x and arrayed periodically at second pitch p2, which is different from first pitch p1, along second direction y.

9 Claims, 10 Drawing Sheets

TM polarized light  TE polarized light

LIGHT EMITTING ELEMENT HAVING STRUCTURAL BODIES ARRAYED AT A FIRST PITCH ALONG A FIRST DIRECTION AND ARRAYED AT A SECOND PITCH DIFFERENT FROM SAID FIRST PITCH ALONG A SECOND DIRECTION AND PROJECTION DISPLAY DEVICE PROVIDED WITH SAME

CROSS REFERENCE TO RELATED APPLICATIONS

This application is a National Stage of International Application No. PCT/JP2010/068153 filed Oct. 15, 2010, claiming priority based on Japanese Patent Application No. 2009-244434 filed Oct. 23, 2009, the contents of all of which are incorporated herein by reference in their entirety.

TECHNICAL FIELD

The present invention relates to a light-emitting element and a projection display apparatus including such light-emitting elements.

BACKGROUND ART

In recent years, there has been proposed a projection display apparatus (LED projector) in which light-emitting diodes (LEDs) are used as light-emitting elements for a light source.

For example, an LED projector for displaying images using a light modulation element such as a liquid crystal panel requires light-emitting elements as a light source thereof to emit light in a controlled polarization state because the liquid crystal panel is polarization-dependent. The light in the controlled polarization state refers to light in which light intensity of a polarization component in a specific direction is higher than light intensities of polarization components in other directions.

One way of controlling a polarization state is to use a polarizer. For example, Patent Literature 1 discloses a light-emitting element including a semiconductor multilayer film having a light-emitting layer and a polarization control layer (polarizer) disposed on the semiconductor multilayer film for controlling the polarization of light that is generated and emitted by the light-emitting layer.

Patent Literature 2 discloses a light-emitting element including a light emitting part for generating light in which light intensity of a polarization component in a specific direction is higher than light intensities of polarization components in other directions, the light emitting part having an active layer comprising a semiconductor in which a principal surface is a nonpolar surface or a semipolar surface. With this configuration, it is possible to control the polarization state of the emitted light without the need for a polarizer.

LED projectors are required to display images with high luminance. The efficiency of extraction of light from the light-emitting surface of a light-emitting element that is used as a light source is an effective way to realize high-luminance light sources.

Optical systems for projecting light onto a light modulation element undergo a limitation of etendue which is determined by the area of a light source and a divergence angle. In order to utilize light emitted from a light source as projection light, the value of the product of the area of the light source and the divergence angle needs to be equal to or smaller than the value of the product of the area of a display element and an acceptance angle (solid angle) that is determined by the F number of a projection lens. Therefore, to realize a high-luminance LED projector which effectively utilizes light emitted from a light source, it is necessary to increase the directivity of the light source to lower etendue.

As a method for increasing the light extraction efficiency and the directivity of light from the light source that are mentioned above, providing a photonic crystal on the light-emitting surface of a light-emitting element is known (see, for example, Patent Literature 3).

Patent Literature 4 proposes a technology of controlling the polarization of emitted light with a polarizer in addition to increasing the light extraction efficiency and the directivity of light. Specifically, a light-emitting element disclosed in Patent Literature 4 includes a reflective polarizing plate (polarizer) and an optical member (photonic crystal) that are disposed on the light-emitting side of a light emitting part for supplying light, the reflective polarizing plate transmitting a specific polarization component and reflecting a polarization component perpendicular to the specific polarization component, the optical member transmitting the light from the reflective polarizing plate and having a refractive index that periodically varies in a two-dimensional direction substantially parallel to a reference surface.

CITATION LIST

Patent Literature

Patent Literature 1: JP2008-60534A
Patent Literature 2: JP2009-111012A
Patent Literature 3: JP2006-310737A
Patent Literature 4: JP2007-109689A

SUMMARY OF INVENTION

Problems to be Solved

However, in the light-emitting element disclosed in Patent Literature 1, light with polarization components other than a specific polarization component is blocked by the polarizer. Therefore, the proportion of the amount of light that passes through the polarizer to the amount of light that is incident on the polarizer is 50% at most. In addition, the light-emitting element disclosed in Patent Literature 2 generates light with a desired polarization component as well as with the other polarization components, and the generated light cannot be utilized by LED projectors.

On the other hand, the light-emitting element disclosed in Patent Literature 3 is not configured to emit light whose polarization state is controlled. Furthermore, in the light-emitting element disclosed in Patent Literature 4, arranging the photonic crystal depending on the polarization state of light that passes through the reflective polarizing plate is not taken into account. Specifically, in the light-emitting element disclosed in Patent Literature 4, since the structure of the photonic crystal is not optimized for light of a specific polarization component, it is difficult to emit the light of a specific polarization component with high efficiently from a light source having high luminance and high directivity.

It is an object of the present invention to provide a light-emitting element which will solve the above problems and which has high luminance and high directivity and emits light in a controlled polarization state. It is also an object of the present invention to provide a projection display apparatus including such light-emitting elements.

Solution to Problems

To achieve the above object, a light-emitting element according to the present invention comprises a substrate and a light emitting part disposed on the substrate for emitting light in which light intensity of a polarization component in a first direction substantially parallel to said substrate is higher than light intensities of polarization components in other directions. The light emitting part includes an active layer for emitting light and a plurality of structural bodies disposed on a light-emitting side of the light emitting part with respect to the active layer and arrayed two-dimensionally along a surface substantially parallel to the active layer. Each of the structural bodies has a width along the first direction and a width along a second direction perpendicular to the first direction, the width along the first direction and the width along the second direction being different from each other in a cross section parallel to the active layer. The structural bodies are arrayed periodically at a first pitch along the first direction and arrayed periodically at a second pitch, which is different from the first pitch, along the second direction.

A projection display apparatus according to the present invention includes a light source including the light-emitting element described above, a light modulation element for modulating light emitted from the light source depending on an image signal, and a projection optical system for projecting the light modulated by the light modulation element.

Effects of Invention

According to the present invention, a light-emitting element is provided which has high luminance and high directivity and emits light in a controlled polarization state.

DESCRIPTION OF EMBODIMENTS

Embodiments of the present invention will be described below with reference to the drawings.

A light-emitting element according to a first embodiment of the present invention will first be described below with reference to FIGS. 1A to 8.

Figure 1A:
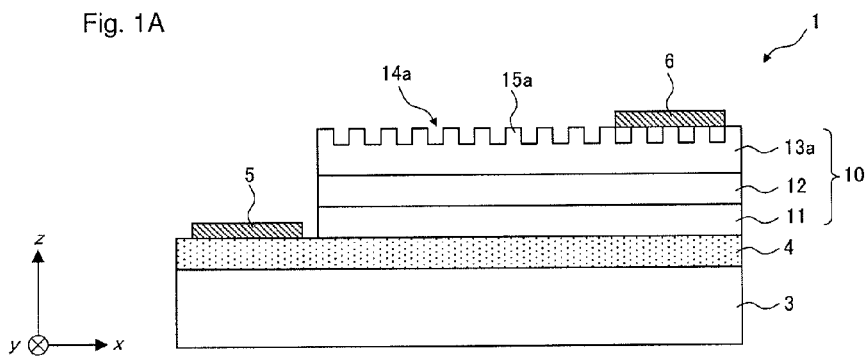
FIG. 1A is a schematic cross-sectional view of a light-emitting element according to a first embodiment of the present invention.
Figure 1B:
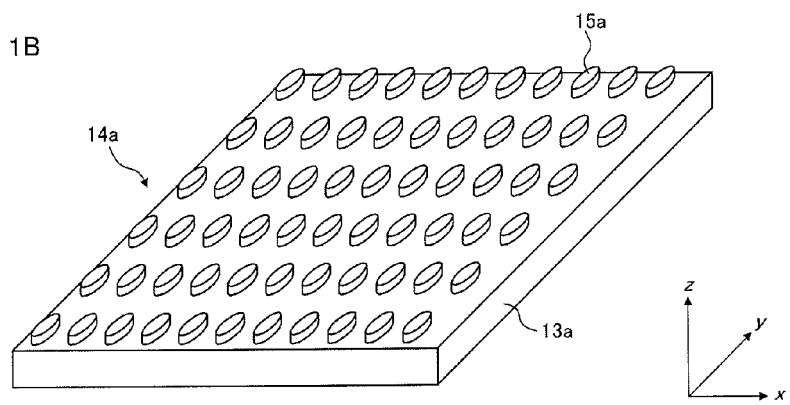
FIG. 1B is a schematic perspective view showing a photonic crystal of the light-emitting element according to the first embodiment of the present invention.
Figure 1C:
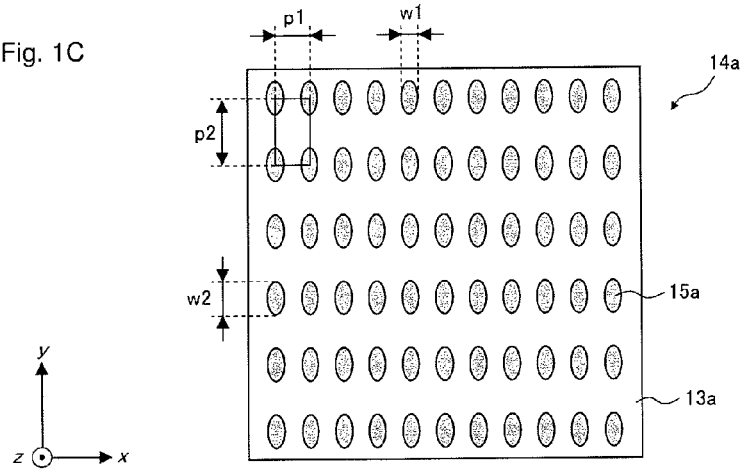
FIG. 1C is a schematic plan view showing the photonic crystal shown in FIG. 1B.

FIGS. 1A to 1C schematically show the light-emitting element according to the present embodiment. FIG. 1A is a schematic cross-sectional view of the light-emitting element according to the present embodiment, showing a cross section along a direction perpendicular to a substrate. FIGS. 1B and 1C are a schematic perspective view and a schematic plan view, respectively, of a photonic crystal (a plurality of structural bodies) on the light-emitting element according to the present embodiment. As shown in FIGS. 1A to 1C, a plane parallel to the substrate, i.e., a plane parallel to the light-emitting surface of the light-emitting element, will be referred to as an xy plane, and a direction perpendicular to the substrate as a z direction.

Light-emitting element 1 according to the present embodiment includes substrate 3, reflecting layer 4 disposed on substrate 3, positive electrode 5 and light emitting part 10 which are disposed on reflecting layer 4, and positive electrode 6 disposed on a light-emitting surface of light emitting part 10.

Light emitting part 10 has semiconductor layers which comprise p-type semiconductor layer 11 disposed on an upper surface of reflecting layer 4, active layer 12 disposed on p-type semiconductor layer 11, for generating light, and n-type semiconductor layer 13a disposed on active layer 12. P-type semiconductor layer 11 is made of GaN doped with magnesium. Active layer 12 consists of alternate layers of InGaN and GaN and has a quantum well structure. N-type semiconductor layer 13a is made of electrically conductive GaN doped with silicon. Each semiconductor layer 11, 12, 13a is formed on reflecting layer 4 such that its principal surface is either a nonpolar surface or a semipolar surface. The principal surface is defined as a plane parallel to the xy plane. Active layer 12 is thus capable of generating light in which the light intensity of a polarization component in a specific direction is high. The direction of the polarization component having a high light intensity will hereinafter be referred to as "direction of polarization". According to the present embodiment, active layer 12 is arranged such that the direction of polarization of the light emitted from active layer 12 is an x direction (first direction).

According to the present embodiment, photonic crystal 14a is disposed on the light-emitting surface of light emitting part 10, i.e., the upper surface of n-type semiconductor layer 13a, in order to increase the efficiency of extraction and the directivity of light whose direction of polarization is the x direction.

As shown in FIG. 1B, photonic crystal 14a comprises a plurality of protrusions 15a projecting from the surface of n-type semiconductor layer 13a and arrayed two-dimensionally and periodically along the x direction and the y direction. As shown in FIG. 1C, each of protrusions 15a as viewed from the z direction is shaped so as to extend in a direction (y direction) perpendicular to the direction of polarization (x direction) of the light generated by active layer 12 that lies beneath n-type semiconductor 13a. In other words, each of protrusions 15a has width w1 along the x direction (first direction) as the direction of polarization of the emitted light and width w2 along the y direction (second direction) perpendicular to the x direction, width w1 being smaller than width w2. According to the present embodiment, furthermore, the duty ratio of photonic crystal 14a is 0.5 in both the x direction and the y direction for reasons to be described later. Specifically, both ratio r1=w1/p1 of width w1 along the x direction to pitch p1 along the x direction (first pitch), and ratio r2=w2/p2 of width w2 along the y direction to pitch p2 along the y direction (second pitch) are 0.5.

In photonic crystal 14a according to the present embodiment, protrusions 15a thus configured are arrayed periodically along the direction of polarization (x direction) of the light generated by active layer 12 and the direction (y direction) perpendicular thereto. As shown in FIG. 1C, pitches p1, p2 along the x direction and the y direction are different from each other and satisfy the relationship: p2>p1. If the relationship: p2>p1 is satisfied, then it is possible to increase the light extraction efficiency and the directivity of light when the light generated by the active layer is extracted from the light-emitting element through the photonic crystal. This is a new finding that the inventor of the present invention has made based on the results of calculations shown below, and serves as an essential feature of the present invention.

Calculations according to an FDTD (Finite-Difference Time-Domain) method carried out to establish optimum pitches of a photonic crystal for increasing the light extraction efficiency and the directivity of light will be described below with reference to FIGS. 2A to 3B.

Figure 2A:
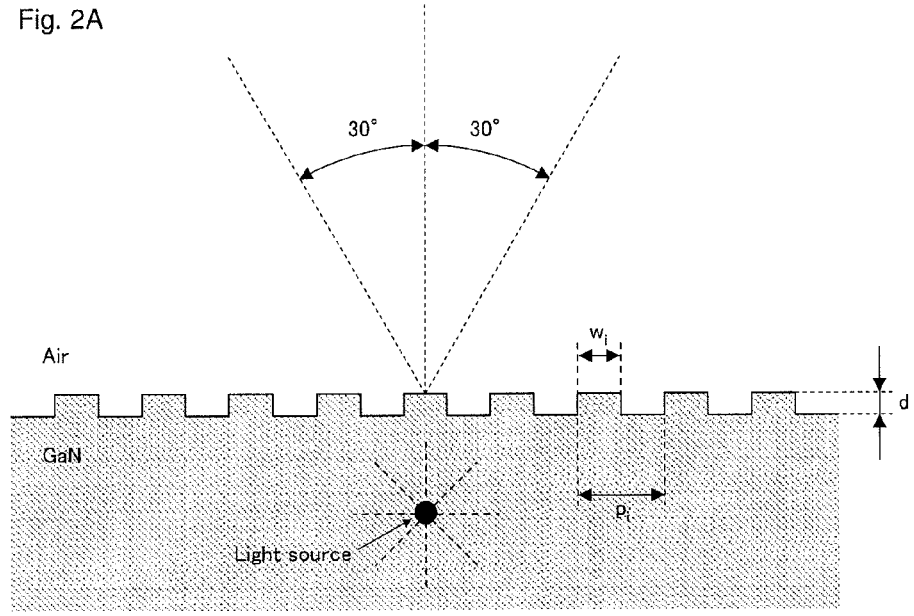
FIG. 2A is a schematic cross-sectional view showing a model of photonic crystal which is used to optimize the photonic crystal according to the present invention.
Figure 2B:
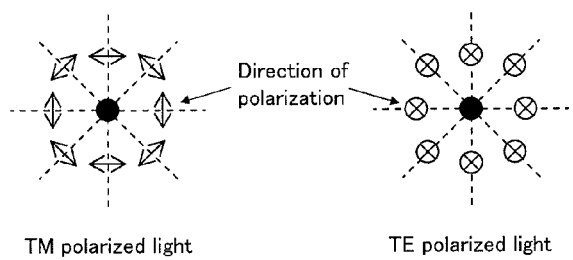
FIG. 2B is a conceptual diagram showing TM polarized light and TE polarized light, which is illustrative of the relationship between directions of polarization and grid directions of the photonic crystal.

FIG. 2A is a schematic cross-sectional view showing a model of photonic crystal which is used for the calculations, along a cross section as viewed from the x direction or the y direction. According to the model, light emitted from a light source disposed in GaN is extracted into air through a photonic crystal disposed on the light-emitting surface. FIG. 2B is a conceptual diagram showing TM polarized light and TE polarized light, which is illustrative of the relationship between directions of polarization and grid directions of the photonic crystal.

The light extraction efficiency has been calculated along two directions, i.e., the grid direction (x direction) parallel to the direction of polarization and the grid direction (y direction) perpendicular to the direction of polarization, with respect to the two-dimensional photonic crystal shown in FIGS. 1B and 1C.

Actually, the model of one-dimensional photonic crystal shown in FIG. 2A has been used, and the light extraction efficiency has been calculated when TM polarized light and TE polarized light (see FIG. 2B), whose respective directions of polarization are perpendicular to each other, are emitted from the photonic crystal. The relationship between the polarization component of the TM polarized light and the grid direction of the one-dimensional photonic crystal is equivalent to the relationship between light whose direction of polarization is the x direction and protrusions arrayed along the x direction in the two-dimensional photonic crystal (see FIGS. 1B and 1C). On the other hand, the relationship between the polarization component of the TE polarized light and the grid direction of the one-dimensional photonic crystal is equivalent to the relationship between light whose direction of polarization is the x direction and protrusions arrayed along the y direction in the two-dimensional photonic crystal. Therefore, for one-dimensional photonic crystal shown in FIG. 2A, calculating the efficiency of extraction of the TM polarized light provides the light extraction efficiency with respect to pitch p1 along the x direction shown in FIG. 1C, and calculating the efficiency of extraction of the TM polarized light provides the light extraction efficiency with respect to pitch p2 along the y direction of the two-dimensional photonic crystal.

In order to take the directivity into account, the light extraction efficiency represents the proportion of the amount of light emitted within ±30° from the direction perpendicular to the light-emitting surface, to the total amount of light generated by the light source. The calculations have been made on the assumption that the photonic crystal (protrusions) is of a rectangular cross-sectional shape having a duty ratio of 0.5. In addition, the light extraction efficiency for the emission of light from a photonic crystal of GaN into air has been calculated with respect to pitch pi normalized by wavelength λ of the emitted light in vacuum by varying height d of the crystal (protrusions).

Figure 3A:
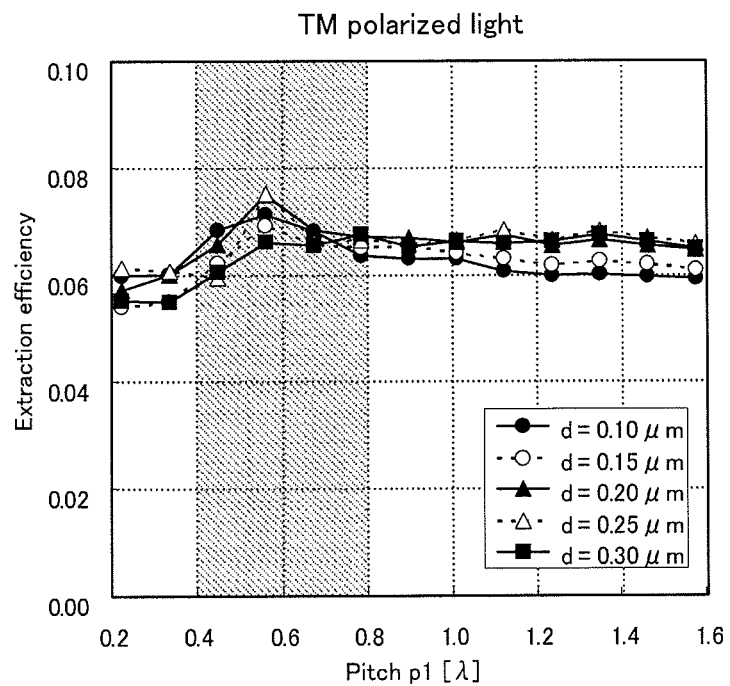
FIG. 3A is a graph showing the result of calculation of the efficiency of extraction of TM polarized light with respect to pitch of the photonic crystal shown in FIG. 2A.
Figure 3B:
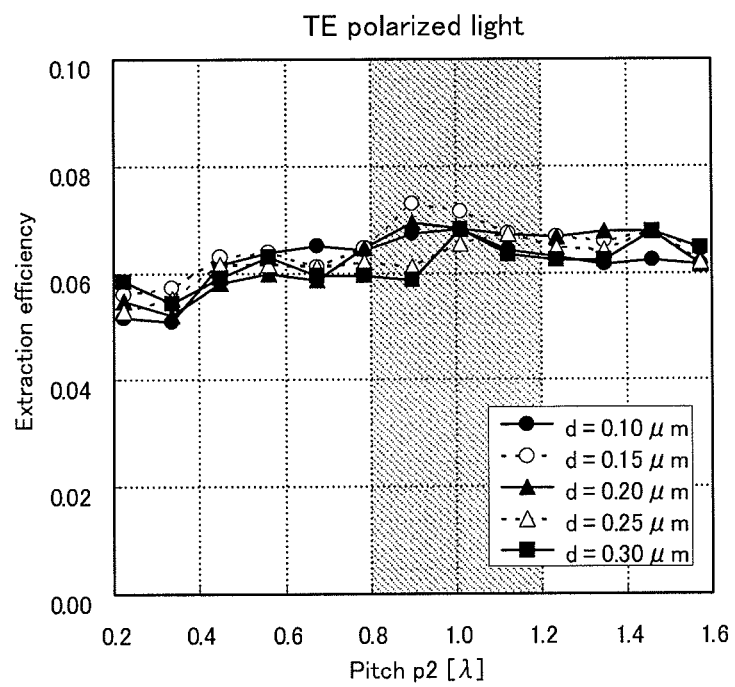
FIG. 3B is a graph showing the result of calculation of the efficiency of extraction of TE polarized light with respect to pitch of the photonic crystal shown in FIG. 2A.

FIGS. 3A and 3B show the results of calculation of the light extraction efficiency with respect to period (pitch) of the photonic crystal thus obtained. FIG. 3A shows the result of calculation for the TM polarized light, and FIG. 3B shows the result of calculation for the TE polarized light.

As can be seen from FIGS. 3A and 3B, there is a difference in a range of pitches (corresponding to a shaded area in the figure) of the photonic crystal where the light extraction efficiency has local maxima between the TM polarized light and the TE polarized light. For the TM polarized light shown in FIG. 3A, the range from pitches 0.4λ to 0.8λ along the direction parallel to the polarization component is optimum for maximum light extraction efficiency. Therefore, pitch p1 optimized along the x direction of the two-dimensional photonic crystal with respect to the light whose direction of polarization is the x direction is in the range of 0.4λ<p1<0.8λ. Similarly, for the TE polarized light shown in FIG. 3B, pitch p2 optimized along the y direction of the two-dimensional photonic crystal with respect to the light whose direction of polarization is the x direction is in the range of 0.8λ<p2<1.2λ. Consequently, the relationship between pitches p1, p2 along the respective directions of the photonic crystal and wavelength λ of the emitted light in vacuum satisfies:

$$0.4 < (p1/\lambda) < 0.8 < (p2/\lambda) < 1.2 \tag{1}$$

Using the model of one-dimensional photonic crystal shown in FIG. 2A, the efficiencies of extraction of the TM polarized light and the TE polarized light have been calculated by changing the ratio of width wi of the protrusions of the photonic crystal to pitch pi (duty ratio ri=wi/pi) from 0.1 to 0.9. Pitch pi of the photonic crystal has been set to 0.6λ and 1.0λ respectively for the TM polarized light and the TE polarized light, and height d has been set to 0.15 μm for both the TM polarized light and the TE polarized light. In order to take the directivity into account, the light extraction efficiency represents the proportion of the amount of light emitted within ±30° from the direction perpendicular to the light-emitting surface, to the total amount of light generated by the light source.

Figure 4A:
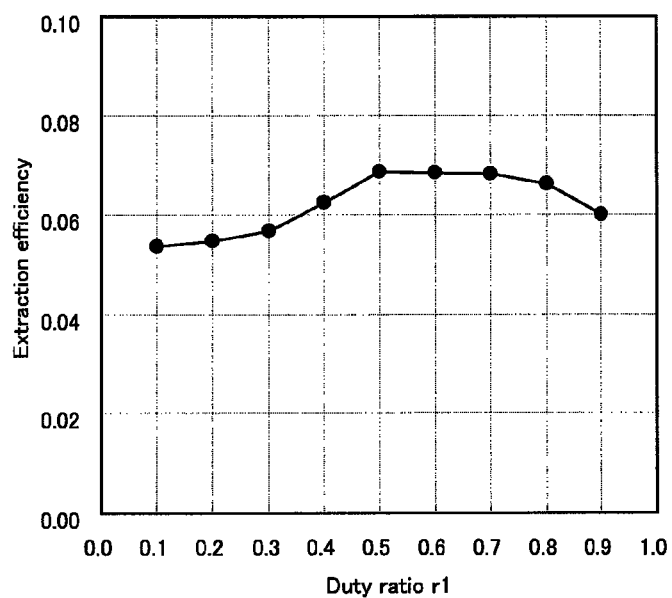
FIG. 4A is a graph showing the result of calculation of the efficiency of extraction of TM polarized light with respect to duty ratio of the photonic crystal shown in FIG. 2A.
Figure 4B:
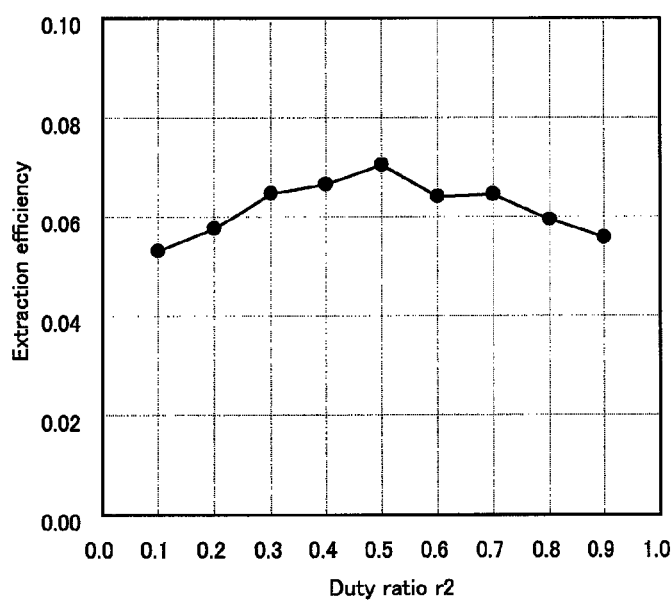
FIG. 4B is a graph showing the result of calculation of the efficiency of extraction of TE polarized light with respect to duty ratio of the photonic crystal shown in FIG. 2A.

FIGS. 4A and 4B show the results of calculation of the extraction efficiency with respect to duty ratios ri thus obtained. FIG. 4A shows the result of calculation for the TM polarized light, and FIG. 4B shows the result of calculation for the TE polarized light.

As can be understood from FIGS. 4A and 4B, the light extraction efficiency varies with the duty ratio. The optimum duty ratio for maximizing the light extraction efficiency is 0.5 for both the TM polarized light and the TE polarized light. As the duty ratio increases or decreases from the optimum value, the light extraction efficiency lowers. In order to achieve a high light extraction efficiency, therefore, duty ratio r1 and duty ratio r2 along the respective directions of the photonic crystal may be 0.5.

Figure 5A:
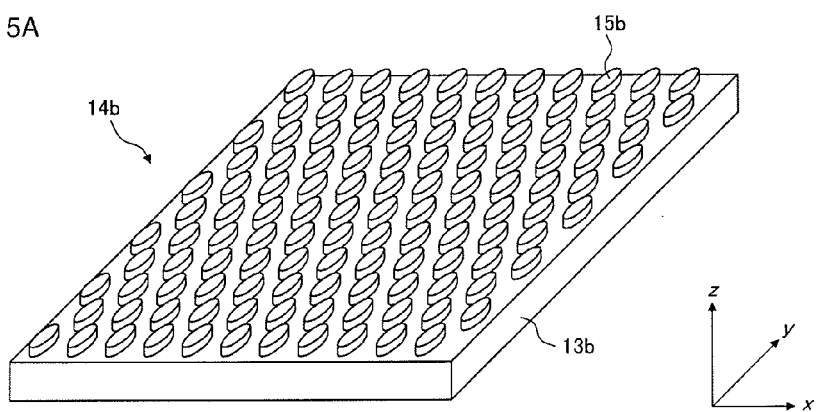
FIG. 5A is a schematic perspective view showing a modification of the photonic crystal of the light-emitting element according to the first embodiment of the present invention.
Figure 5B:
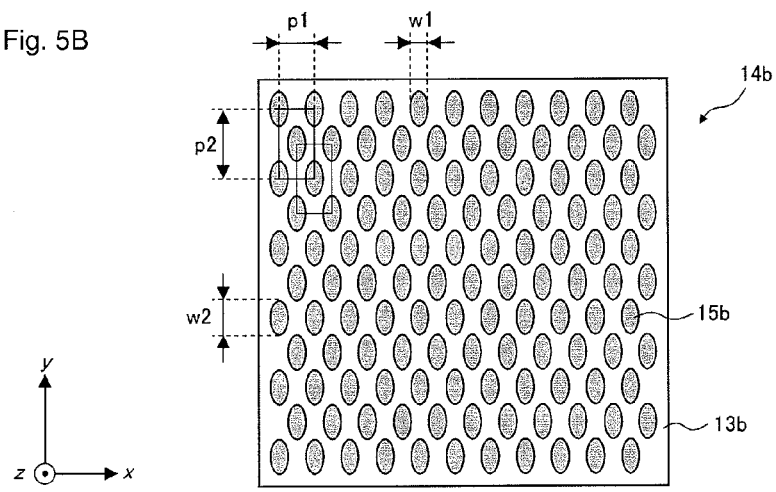
FIG. 5B is a schematic plan view of the photonic crystal shown in FIG. 5A.

The photonic crystal whose periodic structure meets the relationship (1) is not limited to the structure shown in FIGS. 1B and 1C, but may be of a structure shown in FIGS. 5A and 5B. FIGS. 5A and 5B are schematic perspective and plan views, respectively, showing a modification of the photonic crystal of the light-emitting element according to the present embodiment.

Photonic crystal 14b shown in FIGS. 5A and 5B is configured to be a combination of two square grids of protrusions 15a shown in FIGS. 1B and 1C. Protrusions 15b of photonic crystal 14b which are thus arranged have an increased proportion on the surface of n-type semiconductor layer 13b. As a result, photonic crystal 14b shown in FIGS. 5A and 5B also has an advantage in which the light extraction efficiency can be enhanced.

In photonic crystal 14a shown in FIGS. 1B and 1C and photonic crystal 14b shown in FIGS. 5A and 5B, each of protrusions 15a, 15b as viewed from the z direction is of an elliptical shape. However, the protrusions are not limited to such a shape, but may be of another shape, such as a rectangular shape elongated in the y direction, for example, insofar as the width along the x direction and the width along the y direction are different from each other. The protrusions may be of still another geometric shape such as a rhombic shape whose longer diagonal line extends along the y direction.

In FIGS. 3A and 3B, only the results of calculation for the photonic crystal whose protrusions have positive height d was shown. However, similar results of calculation will be obtained for a photonic crystal whose protrusions have negative height d, i.e., which have recesses. Consequently, the photonic crystal according to the present embodiment may have recesses formed so as to be open in the surface of the n-type semiconductor layer.

Figure 6A:
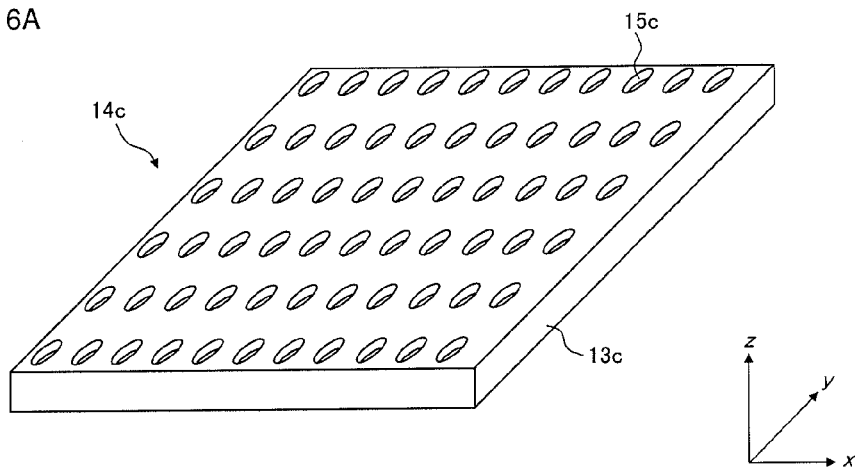
FIG. 6A is a schematic perspective view showing another modification of the photonic crystal of the light-emitting element according to the first embodiment of the present invention.
Figure 6B:
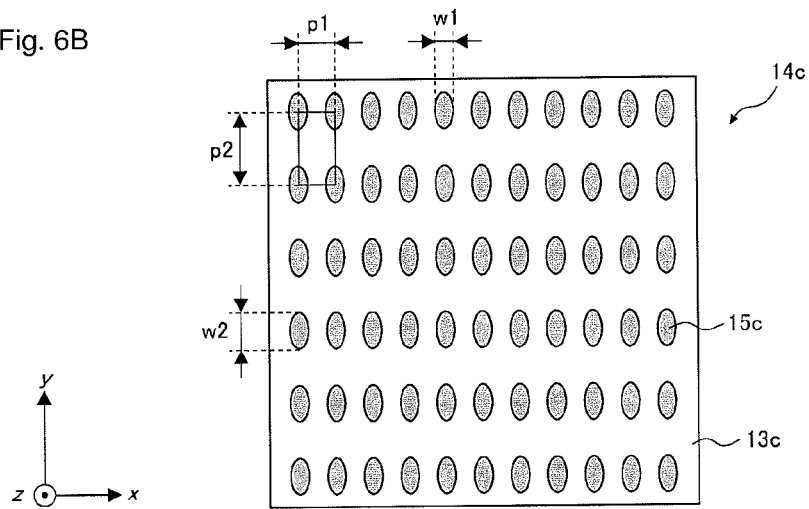
FIG. 6B is a schematic plan view of the photonic crystal shown in FIG. 6A.
Figure 7A:
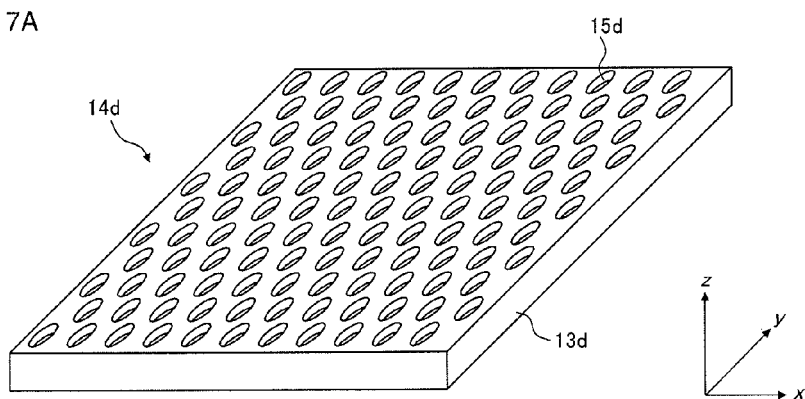
FIG. 7A is a schematic perspective view showing still another modification of the photonic crystal of the light-emitting element according to the first embodiment of the present invention.
Figure 7B:
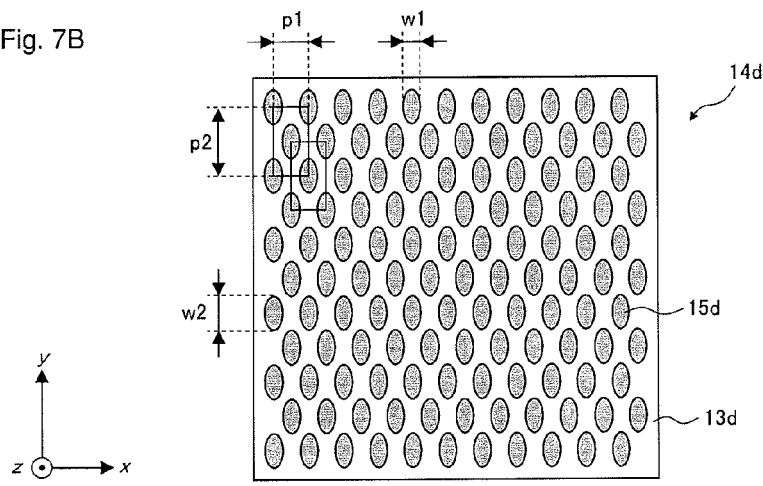
FIG. 7B is a schematic plan view of the photonic crystal shown in FIG. 7A.

FIGS. 6A and 7A are schematic perspective views of such photonic crystals, and FIGS. 6B and 7B are schematic plan views of the photonic crystals shown in FIGS. 6A and 7A. FIGS. 6A and 6B show photonic crystal 14c corresponding to photonic crystal 14a shown in FIGS. 1B and 1C, and FIGS. 7A and 7B show photonic crystal 14d corresponding to photonic crystal 14b shown in FIGS. 5A and 5B. In photonic crystal 14a shown in FIGS. 1B and 1C and photonic crystal 14b shown in FIGS. 5A and 5B, protrusions 15a, 15b have respective widths w1, w2 along the x direction and the y direction. In photonic crystals 14c, 14d shown in FIGS. 6A to 7B, recesses 15c, 15d have respective widths w1, w2 along the x direction and the y direction.

Figure 8A:
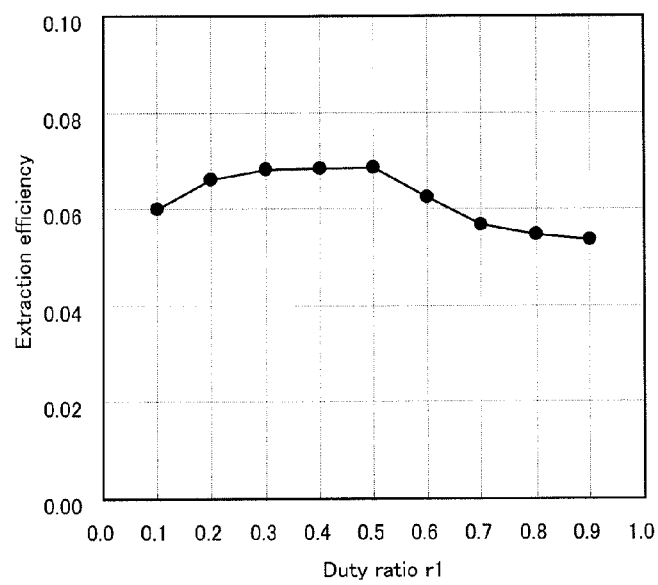
FIG. 8A is a graph showing the result of calculation of the efficiency of extraction of TM polarized light with respect to duty ratio of the photonic crystal shown in FIG. 2A.
Figure 8B:
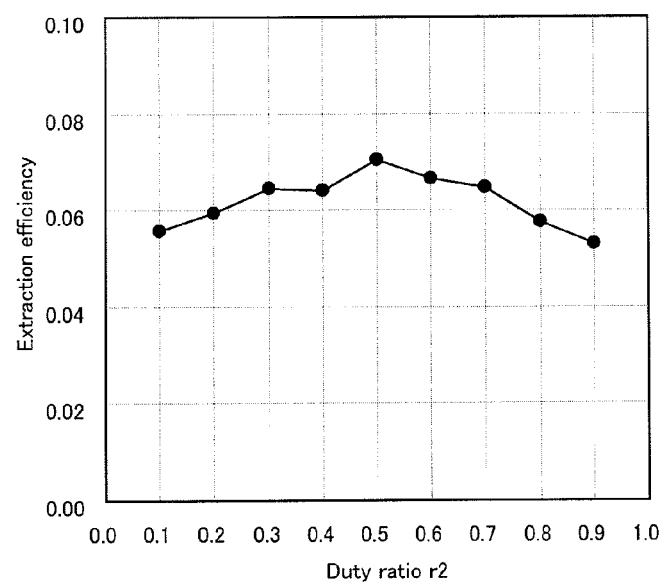
FIG. 8B is a graph showing the result of calculation of the efficiency of extraction of TE polarized light with respect to duty ratio of the photonic crystal shown in FIG. 2A.

FIGS. 8A and 8B show the results of calculation of the efficiency of extraction of the TM polarized light (FIG. 8A) and the TE polarized light (FIG. 8B) by changing the ratio of width wi of the recesses of the photonic crystal to pitch pi (duty ratio ri) from 0.1 to 0.9, using the model of one-dimensional photonic crystal shown in FIG. 2A. As shown in FIGS. 8A and 8B, the calculated efficiencies are in bilaterally symmetrical relation to the calculated efficiencies shown in FIGS. 4A and 4B with respect to a symmetrical axis represented by the duty ratio of 0.5. Therefore, when the photonic crystal includes recesses, as when the photonic crystal includes protrusions, duty ratio r1 and duty ratio r2 along the respective directions of the photonic crystal may be 0.5 in order to achieve a high light extraction efficiency.

In the photonic crystals shown in FIGS. 6A to 7B, as in the photonic crystal shown in FIGS. 1B and 1C and the photonic crystal shown in FIGS. 5A and 5B, the recesses as viewed from the z direction may also be of a rectangular or rhombic shape.

As described above, the light-emitting element according to the present embodiment includes the photonic crystal formed on the light-emitting surface of the light emitting part, the photonic crystal having its periodicity optimized depending on the polarization state of the light emitted from the active layer. Therefore, it is possible to maximize the efficiency of extraction and the directivity of light from the light emitting part.

A light-emitting element according to a second embodiment of the present invention will be described below.

Figure 9:
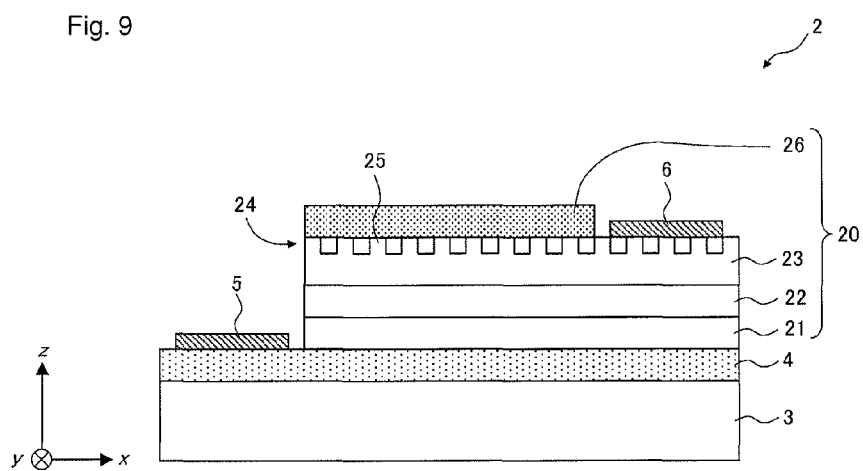
FIG. 9 is a schematic cross-sectional view of a light-emitting element according to a second embodiment of the present invention.

FIG. 9 is a schematic cross-sectional view of the light-emitting element according to the present embodiment, showing a cross section along a direction perpendicular to a substrate.

Light-emitting element 1 according to the present embodiment includes substrate 3, reflecting layer 4 disposed on substrate 3, positive electrode 5 disposed on reflecting layer 4, light emitting part 20 disposed on reflecting layer 4, and positive electrode 6 disposed on a light-emitting surface of light emitting part 20, wherein light emitting part 20 includes semiconductor layers 21 to 23 and polarization selecting layer 26.

As with the first embodiment, light emitting part 20 includes p-type semiconductor layer 21 disposed on an upper surface of reflecting layer 4, active layer 22 disposed on p-type semiconductor layer 21, for generating light, and n-type semiconductor layer 23 disposed on active layer 22.

According to the present embodiment, light emitting part 20 also includes polarization selecting layer 26 comprising a wire grid polarizer, wherein polarization selecting layer 26 is disposed on photonic crystal 24 on an upper surface of n-type semiconductor layer 23 and adapted to transmit a polarization component parallel to the x direction and to reflect other polarization components. Except for polarization selecting layer 26, the present embodiment is of the same appearance as the first embodiment, including the structure of photonic crystal 24.

According to the present embodiment, however, instead of providing polarization selecting layer 26, light emitting part 20 may be configured to emit unpolarized light, not light whose direction of polarization is the x direction. Specifically, each semiconductor layer 21, 22, 23 may be formed on reflecting layer 4 such that its principal surface is a polar surface. At any rate, the light emitted from light emitting part 20 passes through polarization selecting layer 26 after the efficiency of extraction and the directivity of the polarization component along the x direction have been increased by photonic crystal 24. Therefore, light-emitting element 2 according to the present embodiment offers the same advantages as the first embodiment.

According to the present embodiment, as with the first embodiment, the structure and shape of the protrusions of the photonic crystal may be changed.

Finally, a LED projector according to an embodiment as a projection display apparatus which comprises light-emitting elements according to the present invention will be described below.

Figure 10:
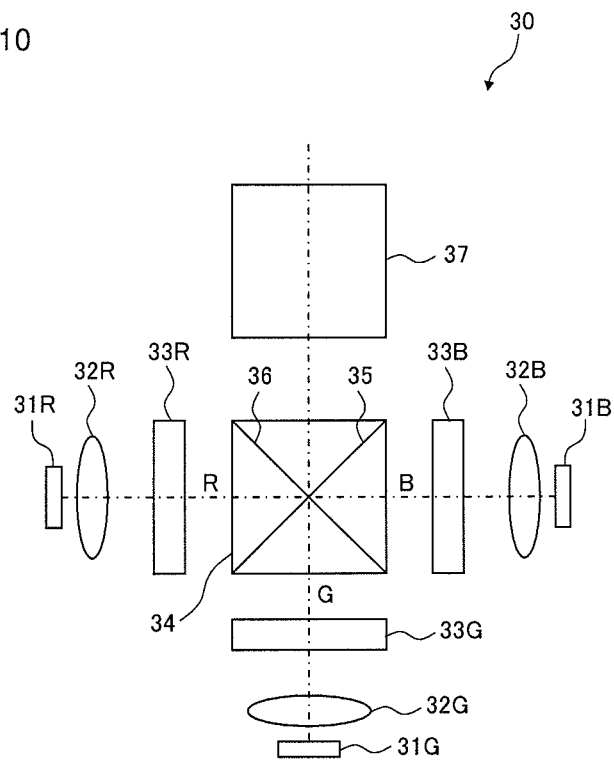
FIG. 10 is a schematic layout diagram showing the arrangement of a projection display apparatus according to an embodiment which comprises light-emitting elements of the present invention.

FIG. 10 is a schematic layout diagram showing the arrangement of an optical system of the LED projector according to the present embodiment.

LED projector 30 according to the present embodiment includes, for respective color lights R (red), G (green), B (blue), light sources 31R, 31G, 31B, and display devices (light modulation elements) 33R, 33G, 33R for modulating color lights R, G, B emitted respectively from light sources 31R, 31G, 31B depending on image information. Light sources 31G, 31B include light-emitting elements according to the present invention. A light-emitting element which employs GaAs, AlGaAs, GaP, GaAs, or the like as a semiconductor material is used for light source 31R. According to the present embodiment, transmissive liquid crystal display devices are used as the display devices.

LED projector 30 according to the present embodiment also includes cross dichroic prism 34 for combining and emitting color lights R, G, B modulated by display devices 33R, 33G, 33B, and projection lens (projection optical system) 37 for projecting the combined lights to display images. Further, lenses 32R, 32G, 32B for applying the lights to the display devices are respectively provided between light sources 31R, 31G, 31B and display devices 33R, 33G, 33B.

Cross dichroic prism 34 includes first film 35 configured to reflect an s-polarization component of red light R and transmit a p-polarization component of green light G and an s-polarization component of blue light B. Cross dichroic prism 34 also second film 36 configured to transmit the s-polarization component of red light R and the p-polarization component of green light G and reflect the s-polarization component of blue light B. The light-emitting elements according to the present invention have increased the efficiency of extraction and the directivity of a polarization component in a specific direction. Therefore, it is possible to increase the light usage efficiency of the optical system of LED projector 30 by arranging light source G and light source B such that the p-polarization component of green light G and the s-polarization component of blue light B serve as the polarization component in the specific direction.

The display devices of the LED projector may alternatively be reflective devices such as reflective liquid crystal devices or digital mirror devices.

While the present invention has been particularly shown and described with reference to the embodiment and the Examples, the present invention is not limited to the embodiment and the Examples described above. It will be understood by those skilled in the art that various changes in form and details may be made therein without departing from the scope of the present invention as defined by the claims.

The present application is based upon and claims the benefit of priority from Japanese Patent application No. 2009-244434, filed on Oct. 23, 2009, the disclosure of which is incorporated herein in its entirety by reference.

EXPLANATION OF REFERENCE NUMERALS 1, 2 Light-emitting element
3 Substrate
4 Reflecting layer
5 Negative electrode
6 Positive electrode
10, 20 Light emitting part
11, 21 p-type semiconductor layer
12, 22 Active layer
13a-13d, 23 n-type semiconductor
14a-14d, 24 Photonic crystal
15a, 15b Protrusion
15c, 15d Recess
26 Polarization selecting layer
30 LED projector
31R, 31G, 31B Light source
32R, 32G, 32B Lens
33R, 33G, 33B Display device
34 Cross dichroic prism
35 First film
36 Second film
37 Projection lens

The invention claimed is:

1. A light-emitting element comprising a substrate and a light emitting part disposed on the substrate,
wherein said light emitting part includes a semiconductor layer comprising a plurality of layers including an active layer for generating light, said active layer configured to emit light in which light intensity of a polarization component in a first direction substantially parallel to said substrate is higher than light intensities of polarization components in other directions, and further includes a plurality of structural bodies disposed on a light-emitting side of said semiconductor layer and arrayed two-dimensionally along a surface substantially parallel to said active layer;
each of said structural bodies has a width along said first direction and a width along a second direction perpendicular to said first direction, the width along said first direction and the width along the second direction being different from each other in a cross section parallel to said active layer; and
said structural bodies are arrayed periodically at a first pitch along said first direction and arrayed periodically at a second pitch, which is different from said first pitch, along said second direction.

2. The light-emitting element according to claim 1, wherein a ratio of the width along said first direction to said first pitch is about 0.5, and a ratio of the width along said second direction to said second pitch is about 0.5.

3. The light-emitting element according to claim 1, wherein when a wavelength of the light emitted from said light emitting part in a vacuum is represented by $\lambda$, said first pitch is represented by p1, and said second pitch is represented by p2, the ratio ($p1/\lambda$) of the first pitch p1 to said wavelength $\lambda$ and the ratio ($p2/\lambda$) of the second pitch p2 to said wavelength $\lambda$ satisfy the following relationship:

$$0.4 < (p1/\lambda) < 0.8 < (p2/\lambda) < 1.2.$$

4. The light-emitting element according to claim 1, wherein a principal surface of said semiconductor layer is a nonpolar surface or a semipolar surface.

5. The light-emitting element according to claim 1, wherein said light emitting part further includes a polarizer disposed on a light-emitting surface of said semiconductor layer assembly, said polarizer being configured to transmit a polarization component parallel to said first direction and to reflect said polarization components in other directions.

6. The light-emitting element according to claim 1, wherein each of said structural bodies is a protrusion formed on a light-emitting surface side of said semiconductor layer.

7. The light-emitting element according to claim 1, wherein each of said structural bodies is a recess formed on a light-emitting surface side of said semiconductor layer.

8. The light-emitting element according to claim 1, wherein said semiconductor layer includes a group-III nitride.

9. The projection display apparatus comprising a light source including a light-emitting element according to claim 1, a light modulation element for modulating light emitted from said light source depending on an image signal, and a projection optical system for projecting the light modulated by said light modulation element.

\* \* \* \* \*